United States Patent [19]
Ido et al.

[11] Patent Number: 6,111,998
[45] Date of Patent: Aug. 29, 2000

[54] SEMICONDUCTOR OPTICAL DEVICE, FIBER OPTICAL AMPLIFIER AND OPTICAL TRANSMISSION SYSTEM

[75] Inventors: Tatemi Ido, Hachioji; Hirohisa Sano, Niiza; Hiroyuki Gomyo, Kokubunji, all of Japan

[73] Assignee: Hitachi, Ltd., Tokyo, Japan

[21] Appl. No.: 08/919,306

[22] Filed: Aug. 28, 1997

[30] Foreign Application Priority Data

Aug. 30, 1996 [JP] Japan ................................ 8-230008

[51] Int. Cl.[7] .................................................. G02B 6/26
[52] U.S. Cl. ........................ 385/29; 385/28; 385/129
[58] Field of Search .......................... 385/27–30, 39, 385/50, 129, 46, 24

[56] References Cited

U.S. PATENT DOCUMENTS

| | | | |
|---|---|---|---|
| 5,379,354 | 1/1995 | Jenkins | 385/46 |
| 5,410,625 | 4/1995 | Jenkins et al. | 385/28 |
| 5,640,474 | 6/1997 | Tayag | 385/43 |

Primary Examiner—Rodney Bovernick
Assistant Examiner—Ellen E. Kim
Attorney, Agent, or Firm—Beall Law Offices

[57] ABSTRACT

A semiconductor optical device, a fiber optical amplifier and an optical transmission system are disclosed. The semiconductor optical device is excellent in the stability of the coupling efficiency and the splitting ratio of a Y-branch. Both the fiber optical amplifier and the optical transmission system operate in a stable manner over a long period of time even if an optical waveguide is employed which is operative in a multi-mode in the transverse direction. The semiconductor optical device has an optical waveguide, a mode filter for transmitting therethrough light of a fundamental mode and blocking the propagation of light of a higher-order mode. The mode filter is provided in at least a part of the optical waveguide. The width of the mode filter is larger than that of the optical waveguide.

15 Claims, 8 Drawing Sheets

FUNDAMENTAL MODE (n=0)

HIGH-ORDER MODE (n=1)

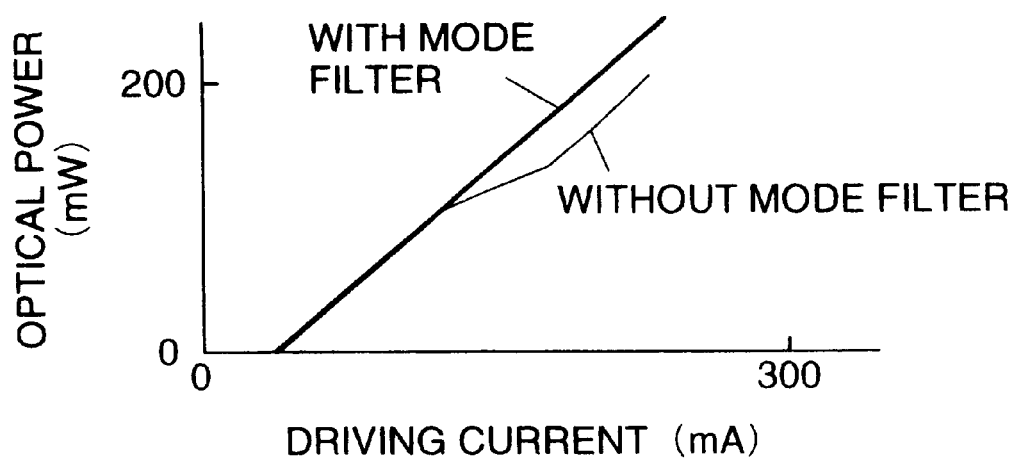

SEMICONDUCTOR OPTICAL DEVICE, FIBER OPTICAL AMPLIFIER AND OPTICAL TRANSMISSION SYSTEM

BACKGROUND OF THE INVENTION

The present invention relates in general to an optical waveguide and more particularly to a semiconductor optical device, such as a laser diode or an optical modulator, having an optical waveguide made of semiconductor materials, a fiber optical amplifier and an optical transmission system.

A semiconductor optical device represented by a semiconductor laser has an optical waveguide which is mainly made of semiconductor materials and which serves; to confine an optical field and propagate therethrough light. This optical waveguide is manufactured in such a way that a plurality of semiconductor layers having different refractive indexes are laminated and then the resultant lamination structure is selectively etched away to form a pattern with several μm width. In the optical waveguide, a cladding layer is doped with impurities so that a current can be injected into a core layer and also an electric field can be applied thereto. As a result, the various functions such as lasing, optical amplification, optical modulation and optical switching can be realized.

SUMMARY OF THE INVENTION

In the optical waveguide of the conventional semiconductor optical device, however, each of the refractive indexes of the semiconductor materials is large and also the refractive-index difference between the layers is large. Therefore, in order to make the optical waveguide have a single mode, the size of the optical waveguide needs to be made remarkably small. Since the laminated structure which confines the optical field perpendicularly to the main surface of the substrate is formed by the crystal growth with accuracy of sub-micron meters, realizing the single mode perpendicular to the substrate of the optical waveguide is relatively readily carried out.

On the other hand, since the optical confinement structure in the direction parallel to the surface of the substrate, i.e., in the transverse direction is manufactured by utilizing both the photolithography and the etching, there is difficulty in that the width w of the optical waveguide is reduced in order to realize transversely the single mode. In addition, in this case, even if the width w of the optical waveguide is reduced in order to realize the single mode, then there arises a problem that the propagation loss is increased or the resistance of the semiconductor optical device is increased. Further, if the optical waveguide having a small width is employed in the semiconductor laser, the light intensity, the carrier density and the stress of the optical waveguide is increased and hence the reliability is reduced. From those reasons, in the actual semiconductor optical device, the optical waveguide which has a single mode in the vertical direction, while having a multi-mode in the transverse direction is forced to be employed in many cases. On the contrary, the semiconductor laser employing the optical waveguide having the multi-mode waveguide shows the transverse-mode instability under the high output power, which results in a practical problem. In addition, the optical switch, the optical modulator and the like each employing the optical waveguide having the multi-mode have the instability of the coupling efficiency and the splitting ratio of the Y-branch. This is another problem.

The present invention has been made mainly to solve the above-mentioned problems associated with the prior art, and it is an object of the present invention to provide a semiconductor optical device, a fiber optical amplifier and an optical transmission system, wherein even if an optical waveguide is employed which has a multi-mode in the transverse direction, the semiconductor optical device is excellent in the stability of the coupling efficiency and the splitting ratio of the Y-branch and also each of the fiber optical amplifier and the optical transmission system operates stably for a long term.

In one aspect of the present invention, there is provided a semiconductor optical device having an optical waveguide wherein a mode filter for transmitting therethrough light of a fundamental mode of the optical waveguide and blocking the propagation of light of a higher-order mode thereof is provided in at least a part of the optical waveguide, and the width of the mode filter is made larger than the width of the optical waveguide.

According to other aspects of the present invention:

(1) in a semiconductor optical device having an optical waveguide, a mode filter for transmitting therethrough light of a fundamental mode of the optical waveguide and blocking light of a higher-order mode thereof is provided in at least a part of the optical waveguide, and the width of the mode filter perpendicular to the direction of propagating light is larger than that of the optical waveguide; or (2) in a semiconductor optical device having an optical waveguide, a mode filter is provided in the middle of the optical waveguide, and the width of the optical waveguide perpendicular to the direction of propagating light, the width of the mode filter and the length of the mode filter in the direction of propagating light are designed in such a way that with respect to light of a fundamental mode of the optical waveguide, the distribution of the light intensity in an inlet port of the mode filter becomes approximately equal to the distribution of the light intensity in an outlet port of the mode filter.

Alternately, in a semiconductor optical device having an optical waveguide made of semiconductor materials, a mode filter may be provided in at least a part of the optical waveguide, and the width of the optical waveguide and the width and the length of the mode filter are determined in such a way that with respect to light of a fundamental mode of the optical waveguide, the distribution of the light intensity in an inlet port of the mode filter becomes approximately equal to the distribution of the light intensity in an outlet port of the mode filter.

In these cases, the width of the mode filter is set to a value which is 1.5 to 4.0 times as large as that of the optical waveguide. In addition, the width of the mode filter is set to the range of 1.5 to 10 μm. In addition, the width of the optical waveguide is set to the range of 1 to 10 μm. Further, the width of the mode filter may be changed in the direction of propagating light. Furthermore, the lamination structure of the mode filter is made the same as that of the optical waveguide. In this case, the uniform lamination structure is formed on the semiconductor substrate, and that lamination structure is selectively etched away so as to form a pattern with the different widths, whereby both the optical waveguide and the mode filter are formed.

In addition, the semiconductor optical device is one of semiconductor laser, an optical modulator and an optical switch. In addition, a Y-branch is provided in the optical waveguide. Further, the semiconductor laser is used in a fiber optical amplifier. Furthermore, the optical modulator is used in an optical transmission system.

BRIEF DESCRIPTION OF THE DRAWINGS

FIG. 6 is a graphical representation showing the relation between the driving current and the optical output power of the semiconductor laser shown in FIG. 5;

DETAILED DESCRIPTION OF THE PREFERRED EMBODIMENTS

Figure 1:
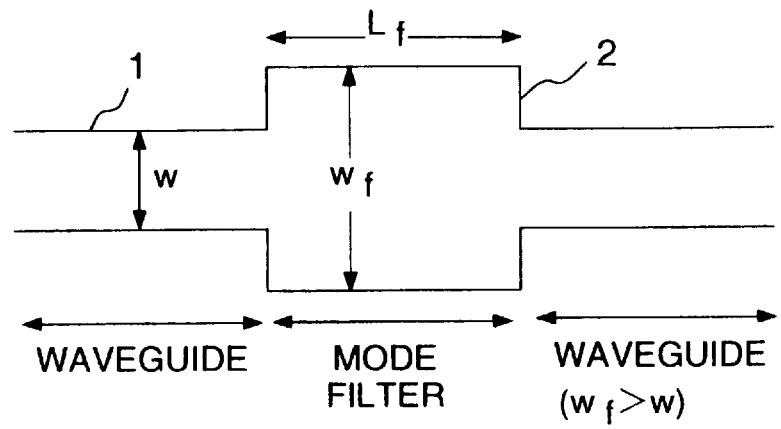
FIG. 1 is a plan view showing a structure, according to an embodiment of the present invention, in which a mode filter is provided in the middle of an optical waveguide.

FIG. 1 is a plan view showing a structure of a semiconductor optical device according to the present invention. As shown in the figure, a mode filter 2 is provided in the middle of an optical waveguide 1, and the width wf of the mode filter 2 is larger than the width w of the optical waveguide 1.

Figure 2A:
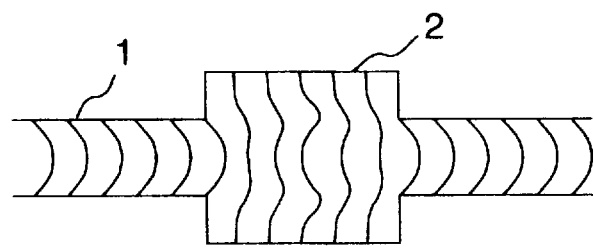
FIGS. 2A and 2B are respectively a schematic view showing the propagation state of light of a fundamental mode through the mode filter in the semiconductor optical device shown in FIG. 1, and a schematic view showing the propagation state of light of a higher-order mode therethrough.
Figure 2B:
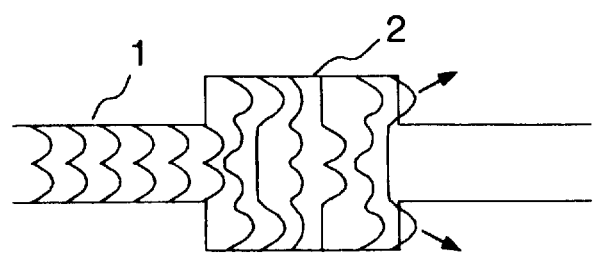

FIG. 2A is a schematic view useful in explaining the propagation state of light of a fundamental mode when the light of a fundamental mode is made incident to the mode filter of the semiconductor optical device shown in FIG. 1 from the left-hand side of the drawing. FIG. 2B is a schematic view useful in explaining the propagation state of light of a higher-order mode (first order mode) when the light of a higher-order mode (first order mode) is made incident to the mode filter thereof from the left-hand side of the drawing. As shown in the figures, the light which has been made incident to the mode filter 2 having the larger width than that of the optical waveguide 1 spreads perpendicularly to the propagation direction, i.e., to the both sides as the light is propagated. When the light is further propagated, it converges centrally again to reproduce the distribution of the light intensity which is approximately equal to the distribution of the light intensity of the incident light. In other words, the light which has been made incident to the mode filter 2 is changed with its form periodically. The period of the light of a fundamental mode is different from that of the light of a higher-order mode, i.e., the period of the light of a higher-order mode is shorter than that of the light of a fundamental mode. Therefore, in the case where the length Lf of the mode filter 2 is set to the period of the light of a fundamental mode, as shown in FIG. 2A, the light of a fundamental mode has the distribution of the light intensity in the outlet port of the mode filter 2 which is approximately equal to the distribution of the light intensity in the inlet port thereof, and hence is converted into the light of a fundamental mode of the optical waveguide on the outlet port side with low loss to be outputted. That is, with respect to the light of a fundamental mode of the optical waveguide 1, the distribution of-the light intensity in the inlet port of the mode filter 2 becomes approximately equal to the distribution of the light intensity in the outlet port of the mode filter 2. On the other hand, as shown in FIG. 2B, the distribution of the light intensity of the light of a higher-order mode is concentrated outwardly in the outlet port of the mode filter 2 and hence the light of a higher-order mode is hardly coupled to the mode of the optical waveguide 1 on the output side. In such a way, only the light of a higher-order mode can undergo the large loss through the mode filter 2. That is, by providing the mode filter 2 in the middle of the optical waveguide 1, the optical waveguide 1 of a multi-mode can behave as is it is the optical waveguide of a single mode.

Then, in the case where the mode filter 2 is provided in the middle of the optical waveguide 1 of the semiconductor laser, even if the optical waveguide 1 is transversely of a multi-mode, since the light of a high-order mode undergoes the large loss therethrough, the lasing of the light of a higher-order mode can be suppressed. Therefore, even if the optical output power is increased, it is possible to show no instability of the beam-spot mode competition. As a result, the optical waveguide 1 which has the larger width w than that of the conventional one can be used, and hence the maximum optical output of the semiconductor can be increased and also the reliability thereof can be improved. In addition, in the case where the mode filter 2 is provided in the middle of the optical waveguide 1 of the passive semiconductor optical device, it is possible to cancel the instability of the optical coupling due to the multi-mode of the optical waveguide 1.

Incidentally, when the difference between the width wf of the mode filter 2 and the width w of the optical waveguide 1 is small, the light which has been concentrated on the end of the optical waveguide 1 in the outlet port of the mode filter 2 leaks out from the outlet port of the mode filter 2 to the optical waveguide 1 on the outlet port side, and hence the loss of the light of a higher-order mode becomes small. From this reason, it is desirable that the width wf of the mode filter 1 is set to a value which is 1.5 or more times as large as the width w of the optical waveguide 1.

Figure 3:
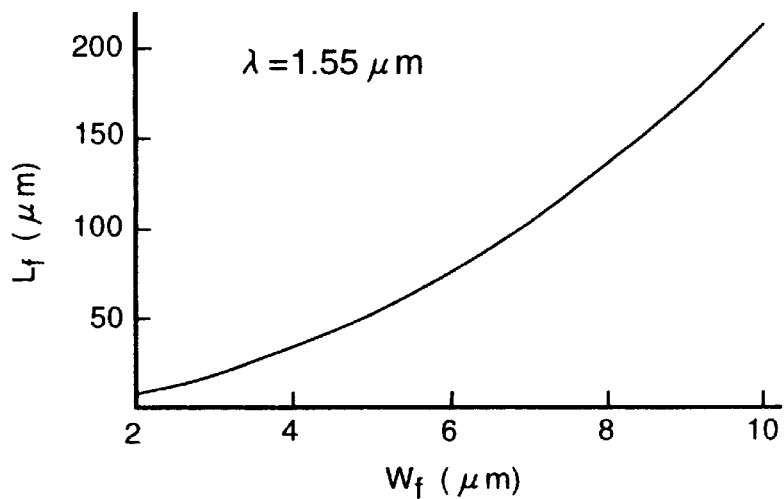
FIG. 3 is a graphical representation showing the relation between the length Lf and the width Wf of the mode filter in the semiconductor optical device shown in FIG. 1.

FIG. 3 is a graphical representation showing the relation between the length Lf and the width wf of the mode filter 2 in the case where the wavelength λ of light is 1.55 μm, and with respect to the light of a fundamental mode of the optical waveguide 1, the distribution of the light intensity in the inlet port of the mode filter 1 is approximately equal to the distribution of the light intensity in the outlet port of the mode filter 2. As apparent from this graphical representation, the length Lf of the mode filter 2 increases exponentially as the width wf thereof increases. Therefore, if the width wf of the mode filter 1 is unnecessarily increased, then the length Lf of the mode filter 2 becomes greatly large, and as a result, the size of the semiconductor optical device becomes large. Therefore, it is desirable that the width wf of the mode filter 2 is set to a value which is 4 or less times as large as the width w of the optical waveguide 1. In addition, as apparent from the graphical representation shown in FIG. 3, in order to make the length Lf of the mode filter 2 200 μm or less, the width wf of the mode filter 2 needs to be made 10 μm or less. In addition, when the width w of the optical waveguide 1 is increased, the width wf of the mode filter 2 must be increased. In the end, since the length Lf of the mode filter 2 needs to be made remarkably large, it is desirable that the width of the optical waveguide 1 is set to the range of 1 to 10 μm.

Figure 4A:
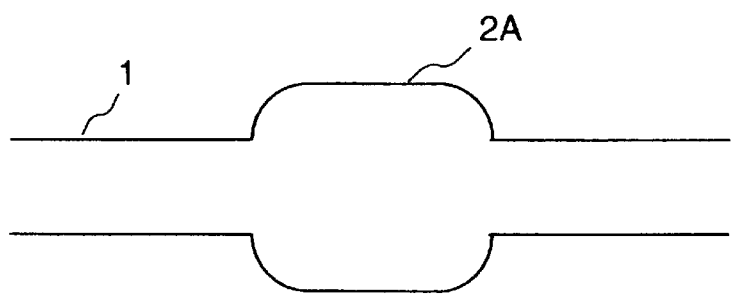
FIGS. 4A and 4B are respectively plan views each showing a plan form of a mode filter according to another embodiment of the present invention.
Figure 4B:
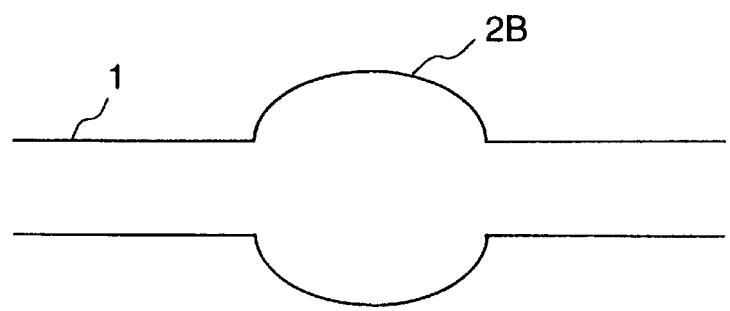

In addition, the shape of the mode filter is not necessarily rectangular. That is, for example, as shown in FIGS. 4A and 4B, the mode filters 2A and 2B each having the shape in which the width thereof is varied in the travelling direction of the light may also be provided. In this case, the length of each of the mode filters 2A and 2B is set in such a way that with respect to the light of a fundamental mode of the optical waveguide 1, the distribution of the light intensity in the inlet port of the mode filter becomes approximately equal to the distribution of the light intensity in the outlet port thereof, whereby it is possible to realize the same function as that of the mode filter 2 shown in FIG. 1.

Figure 5A:
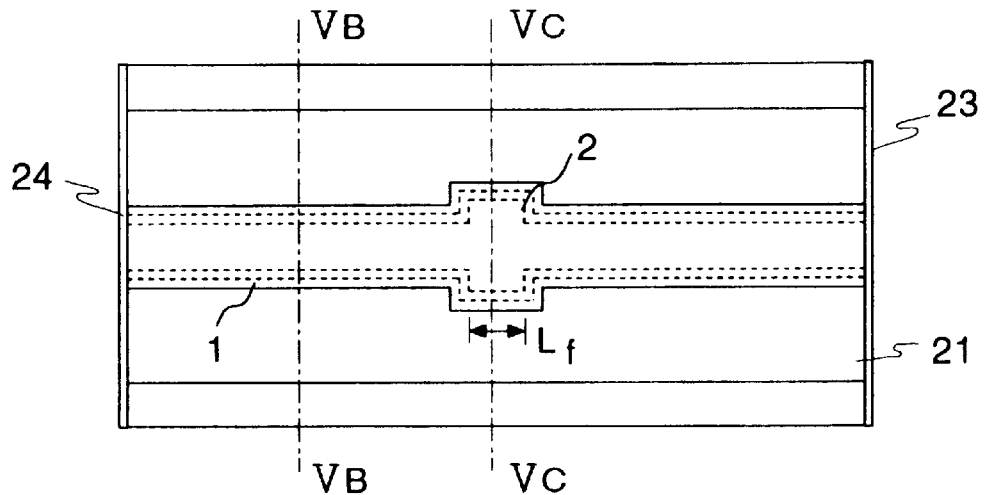
FIG. 5A is a plan view showing a plan structure of a semiconductor laser according to an embodiment of the present invention.
Figure 5B:
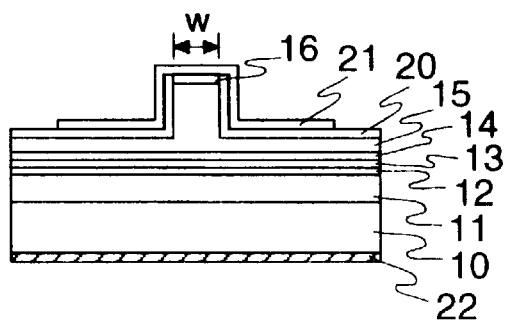
FIG. 5B is a cross-sectional view taken on line VB—VB of FIG. 5A.
Figure 5C:
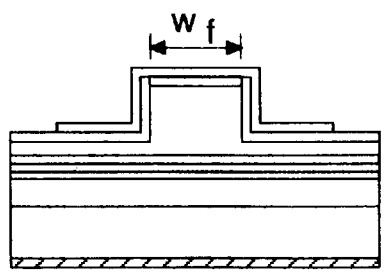
FIG. 5C is a cross-sectional view taken on line VC—VC of FIG. 5A.

FIG. 5A is a plan view showing a structure of a semi-conductor laser with 0.8 μm wavelength according to the present invention, FIG. 5B is a cross-sectional view taken on line VB—VB of FIG. 5A, and FIG. 5C is a cross-sectional view taken on line VC—VC of FIG. 5A. As shown in these figures, on an n type GaAs substrate 10, an n type $Al_{0.4}Ga_{0.6}As$ cladding layer 11 (1.5 μgm), an n type $Al_{0.2}Ga_{0.8}As$ guide layer 12 (0.05 μm), GaAs active layer 13 (0.15 μm), an n type $Al_{0.1}Ga_{0.8}As$ guide layer 14 (0.05 μm), a p type $Al_{0.4}Ga_{0.8}As$ cladding layer 15 (1.5 μm), and a $p^+$ type GaAs contact layer 16 are formed in this order by the MBE (molecular beam epitaxy) method, and then a part of the $p^+$ type GaAs contact layer 16 and the p type $Al_{0.4}Ga_{0.6}As$ cladding layer 15 (1.5 μm) is etched away to form both an optical waveguide 1 and a mode filter 2. In addition, the width w of the optical waveguide 1 is 3 μm, the width wf of the mode filter 2 is 6 μm, and the length Lf of the mode filter 2 is about 50 μm. In addition, a $SiO_2$ as a film for passivation is formed, and also a p type electrode 21 and an n type electrode 22 are respectively formed by the vacuum evaporation method. Incidentally, a semiconductor laser (its devide length is 600 μm) is cut out by the cleavage, and also a low-reflection film 23 and a high-reflection film 24 are formed on the faces of the waveguide which are mutually opposited to each other, of the semiconductor laser, respectively.

Then, the driving current-optical power characteristics of the semiconductor laser having the mode filter 2 provided therein shown in FIGS. 5A to 5C and those of the semiconductor laser having no mode filter 2 are evaluated. While both the semiconductor lasers show approximately the same threshold current and slope efficiency, as shown in FIG. 6, in the semiconductor laser device having no mode filter 2, the kink (the bending of the line representing the characteristics) occurs in the driving current-optical power characteristics at the optical output power of about 100 mW, whereas in the semiconductor laser having the mode filter 2 provided therein, the kink is not observed up to the optical output power of 200 mW or more at all, and hence this semiconductor laser operates stably. In addition, since the lamination structure of the mode filter 2 is made the same as that of the optical waveguide 1, the semiconductor laser having the mode filter 2 provided therein can be readily manufactured by the similar process to that in the conventional semiconductor laser. In addition, the lamination structure with uniformly thick layers is formed on the n-type GaAs substrate 10 and then the resultant lamination structure is selectively etched away so as to form a pattern with the different widths, thereby forming both the optical waveguide 1 and the mode filter 2. Therefore, the semiconductor laser can be very readily manufactured.

Figure 7A:
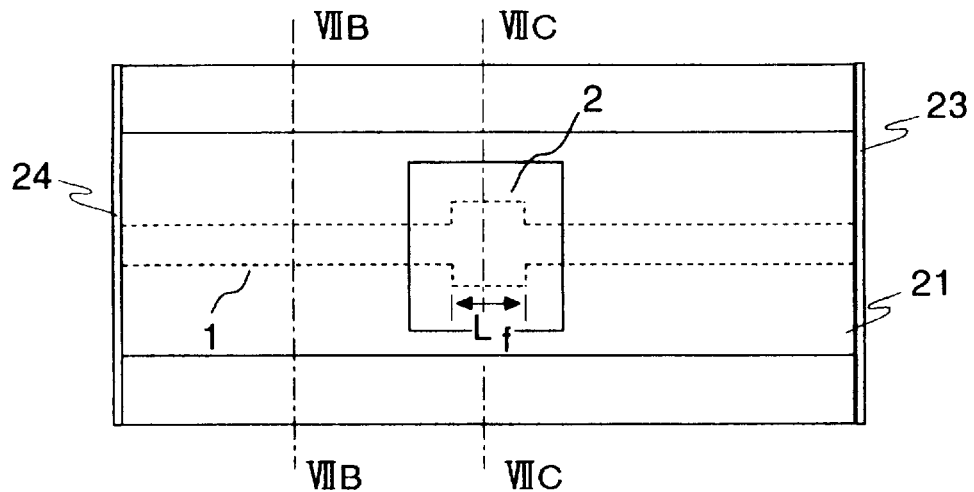
FIG. 7A is a plan view showing a plan structure of a semiconductor laser according to still another embodiment of the present invention.
Figure 7B:
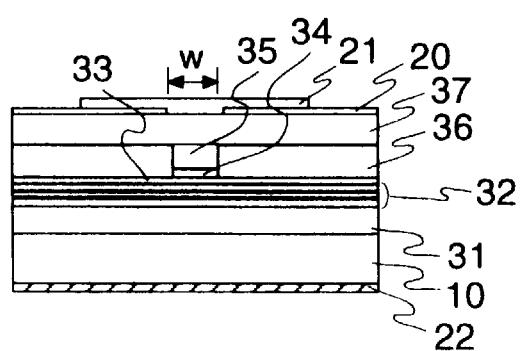
FIG. 7B is a cross-sectional view taken on line VIIB—VIIB of FIG. 7A.
Figure 7C:
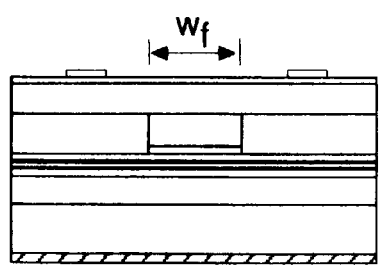
FIG. 7C is a cross-sectional view taken on line VIIC—VIIC of FIG. 7A.

FIG. 7A is a plan view showing a structure of a semi-conductor laser with 0.98 μm wavelength according to the present invention, FIG. 7B is a cross-sectional view taken on line VIIB—VIIB of FIG. 7A and FIG. 7C is a cross-sectional view taken on line VIIC—VIIC of FIG. 7A. As shown in these figures, on an n type GaAs substrate 10, an n type InGaP cladding layer 31 (1.5 μm), two pairs of $In_{0.2}Ga_{0.8}As$/GaAs quantum wells 32, a p type InGaP etching stop layer 33, a GaAs guide layer 34 (0.10 μm), and a p type InGaP cladding layer 35 (1.5 μm) are formed in this order by the MOVPE (metal organic vapor phase epitaxy) method, and then both the p type InGaP cladding layer 35 and the GaAs guide layer 34 are selectively etched away with a $SiO_2$ layer (not shown) as an etching mask to form both an optical waveguide 1 and a mode filter 2. In addition, the width w of the optical waveguide 1 is 4 μm, the width wf of the mode filter 2 is 8 μm, and the length Lf thereof is about 60 μm. In addition, an n type InGaP layer 36 is formed by the buried growth method, and after removing the $SiO_2$ mask layer, a p type GaAs flattening layer 37 (1 μm) is formed. In addition, an $SiO_2$ film 20 as the passivation film is formed, and a p type electrode 21 and an n type electrode 22 are respectively formed by the vacuum evaporation method. Incidentally, the semiconductor laser (its device length is 600 μm) is cut out by the cleavage method, and a low-reflection film 23 and a high-reflection film 24 are formed on the faces of the waveguide of the semiconductor laser, respectively.

Then, the driving current-optical power characteristics of the semiconductor laser having the mode filter 2 provided therein shown in FIGS. 7A to 7C and those of the semiconductor laser having no mode filter 2 are evaluated. While both the semiconductor lasers show approximately the same threshold current and slope efficiency, in the semiconductor laser device having no mode filter 2, the kink occurs in the driving current-optical power characteristics at the optical power of about 100 mW, whereas in the semiconductor laser device having the mode filter 2 provided therein, the kink is not observed up to the optical output power of 200 mW or more at all, and hence this semiconductor laser operates stably.

Figure 8A:
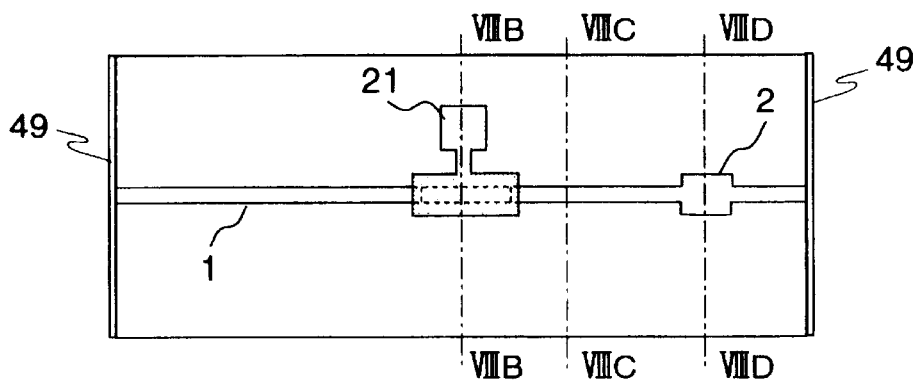
FIG. 8A is a plan view showing a plan structure of an electroabsorption optical modulator according to an embodiment of the present invention.
Figure 8B:
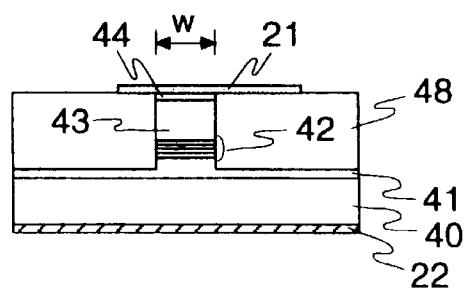
FIG. 8B is a cross-sectional view taken on line VIIIB—VIIIB of FIG. 8A.
Figure 8C:
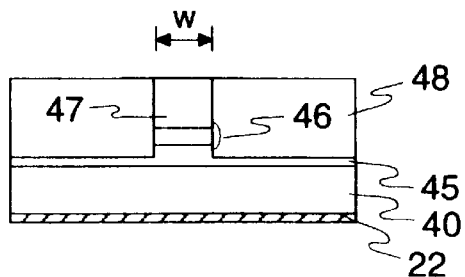
FIG. 8C is a cross-sectional view taken on line VIIIC—VIIIC of FIG. 8A.
Figure 8D:
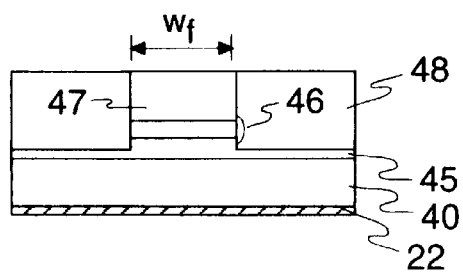
FIG. 8D is a cross-sectional view taken on line VIIID—VIIID of FIG. 8A.

FIG. 8A is a plan view showing a structure of an electroabsorption optical modulation according to the present invention, FIG. 8B is a cross-sectional view taken on line VIIIB—VIIIB of FIG. 8A, FIG. 8C is a cross-sectional view taken on line VIIIC—VIIIC of FIG. 8A, and FIG. 8D is a cross-sectional view taken on line VIIID—VIIID of FIG. 8A. As shown in these figures, on an n type InP substrate 40, an n type InAlAs buffer layer 41 (0.5 µm), ten pairs of InGaAs InAlAs quantum wells layer (their band gap wavelength being 1.50 µm) 42, a p type InAlAs cladding layer 43 (2.0 µm), and a p$^+$ type InGaAs contact layer 44 are formed in this order by the MBE (molecular beam epitaxy) method. Then, the epitaxial layer is selectively etched away by the selective etching except for the area in which a p type electrode 21 will be formed later, and on the resultant area, an InP cladding layer 45 (0.5 µm), an InGaAsP core layer 46 (its thickness is 0.2 µm, and its band gap wavelength is 1.15 µm), and an InP cladding layer 47 (1.5 µm) are formed in this order by the MOVPE method. Then, both an optical waveguide 1 and a mode filter 2 are respectively formed by the selective etching, the flattening is carried out with a polyimide layer 45, both a p type electrode 21 and an n type electrode 22 are respectively formed, and antireflection films 49 are respectively formed on the mutually-opposed end faces of the optical modulator. Still, the width w of the optical waveguide 1, and the width wf and the length Lf of the mode filter 2 are 4 µm, 7 µm and about 80 µm, respectively.

With respect to each of the electroabsorption optical modulator having the mode filter 2 provided therein shown in FIGS. 8A to 8D and the electroabsorption optical modulator having no mode filter 2, the associated mutually-opposed end faces are optically coupled to each other using tapered-lens fibers in order to evaluate the device characteristics. Then, the electroabsorption optical modulator having no mode filter 2 shows the instability, inherent in the multi-mode optical waveguide, in which if the position of the optical fiber on the light incident side is changed, then the position of the minimum insertion loss of the optical fiber on the light emitting side is also changed. On the other hand, in the electroabsorption optical modulator having the mode filter 2 provided therein, such instability is not observed at all.

Figure 9A:
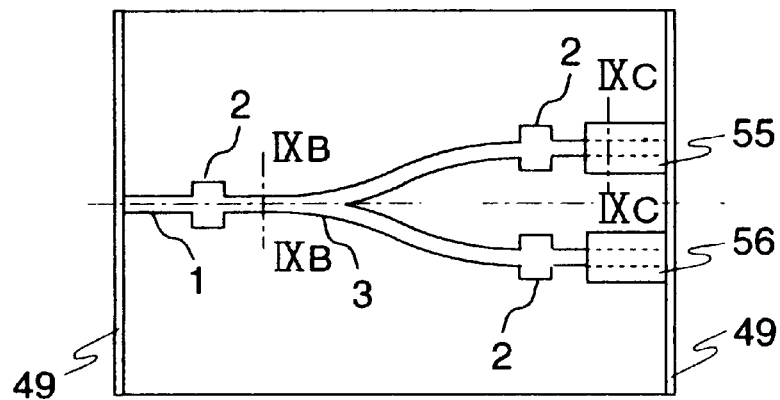
FIG. 9A is a plan view showing a plan structure of a 1×2 optical switch according to an embodiment of the present invention.
Figure 9B:
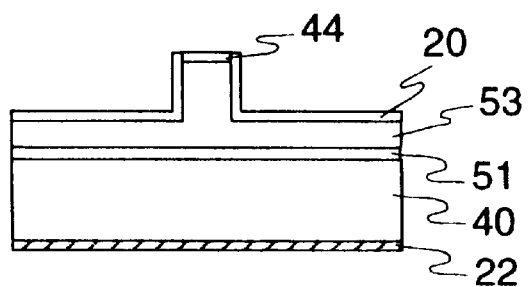
FIG. 9B is a cross-sectional view taken on line IXB—IXB of FIG. 9A.
Figure 9C:
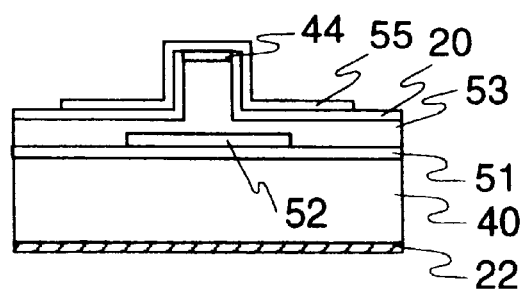
FIG. 9C is a cross-sectional view taken on line IXC—IXC of FIG. 9A.

FIG. 9A is a plan view showing a structure of a 1×2 optical switch according to the present invention, FIG. 9B is a cross-sectional view taken on line IXB—IXB of FIG. 9A, and FIG. 9C is a cross-sectional view taken on line IXC—IXC of FIG. 9A. As shown in these figures, on an n type InP substrate 40, an InGaAsP guide layer 51 (its thickness is 0.2 µm, and its band gap wavelength is 1.15 µm), and an InGaAsP active layer 52 (its thickness is 0.15 µm, and its band gap wavelength is 1.55 µm) are formed in this order. Then, the InGaAsP active layer 52 is selectively removed except for the areas which will be the LD gates later, and a p type InP cladding layer 53 (2.0 µm) and a p$^+$ type InGaAs contact layer 44 are formed in this order on the overall surface of the substrate. Then, p$^+$ type InGaAs contact layer 44 and a upper portion of the p type InP cladding layer 53 are selectively etched away, thereby forming an optical waveguide 1, a Y-branch 3 and mode filters 2 (provided in the three positions). Still, the width w of the optical waveguide 1, and the width wf and the length Lf of the mode filter 2 are 4 µm, 7 µm and about 80 µm, respectively. In addition, LD electrodes 55 and 56 are formed in the respective LD gates. Incidentally, an optical switch is cut out by the cleavage method, and the antireflection films 49 are formed on the mutually-opposed end faces of the optical switch.

In this optical switch, the optical signal which has been made incident to the optical waveguide 1 is divided into two equal parts through the Y-branch 3 and then the resultant two optical signals are subjected to the on off operation in the respective LD gates to be outputted from the optical switch. In such a way, the optical switching is carried out.

Then, the one input and the two outputs of the optical switch shown in FIGS. 9A to 9C are coupled to each other through the tapered-lens fibers, and under this condition, the device characteristics are evaluated. When the optical input of −10 dBm is applied to that optical switch to cause currents of 50 mA to flow through the two LD gate electrodes 55 and 56, respectively, the two approximately equal optical outputs of −10 dbm are obtained from the two outputs of the optical switch, respectively. In addition, when the current is alternately caused to flow through only one of the LD gate electrodes 55 and 56 in order to operate the optical switch, the on off ratio of 40 dB or more is obtained in each case. Further, even if the optical fiber on the light incident side is deviated from the optimal position, the ratio of the magnitudes of the two optical outputs remains 1:1. On the other hand, in the case of the optical switch having no mode filter 2, the ratio of the magnitudes of the two optical outputs is greatly changed depending on the position of the optical fiber on the light incident side.

Figure 10:
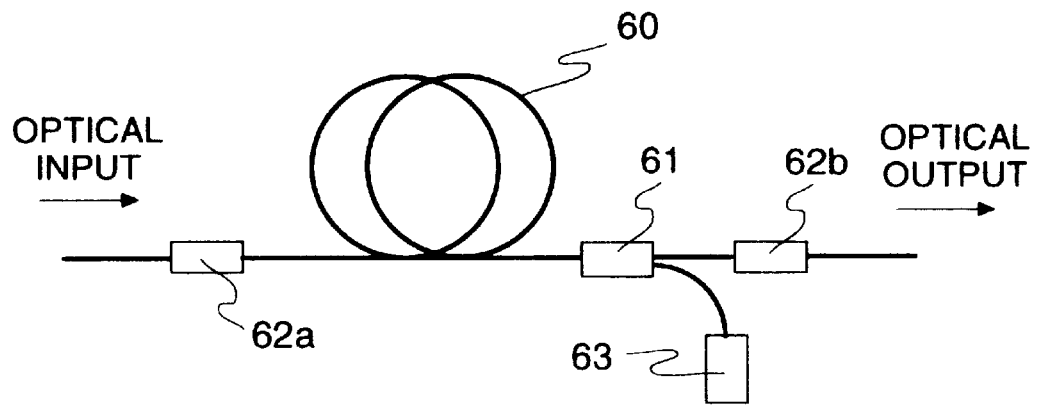
FIG. 10 is a schematic view showing a configuration of a fiber optical amplifier employing the semiconductor laser according to the embodiment of the present invention shown in FIG. 7.

In addition, FIG. 10 is a schematic view showing a structure of a fiber optical amplifier employing the semiconductor laser shown in FIGS. 7A to 7C. As shown in FIG. 10, a WDW coupler 61 is connected to an optical isolator 62a through an EDFA (an optical fiber doped with Er) 60, an optical isolator 62b is connected to the WDW coupler 61, and a semiconductor laser module 63 which is obtained by modularizing the semiconductor laser shown in FIGS. 7A to 7C is connected to the WDW coupler 61.

From this fiber type optical amplifier, the high output of the saturation output of +15 dBm is obtained, and hence this optical amplifier operates stably for a long term.

Figure 11:
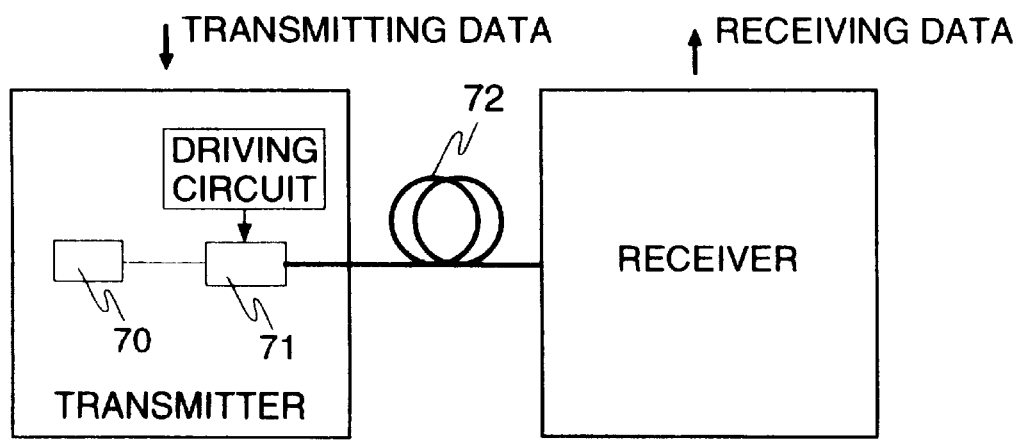
FIG. 11 is a schematic view showing a configuration of an optical transmission system employing the electroabsorption optical modulator according to the embodiment of the present invention shown in FIG. 8.

In addition, FIG. 11 is a block diagram showing a configuration of an optical transmission system employing the electroabsorption optical modulator shown in FIGS. 8A to 8D. As shown in the figure, in a transmitter, a package 71 of the electroabsorption optical modulator shown in FIGS. 8A to 8D is connected to a DFB laser 70, and the package 71 is connected to a receiver through an optical fiber 72.

In this optical transmission system, when the transmission rate is 10 Gbit sec., and the length of the optical fiber 72 is 80 km, the error rate is $10^{-11}$ or less and hence this system operates stably for a long term.

Even if the optical waveguide which is wide and is transversely of a multi-mode is employed, the semiconductor optical device according to the embodiment of the present invention operates stably. Therefore, the device characteristics and reliability are improved.

In addition, when the width of the mode filter is made 1.5 to 4 times as large as that of the optical waveguide, the loss of the light of a higher-order mode is not reduced at all and also the length of the mode filter does not become remarkably large at all. Therefore, the size of the semiconductor optical device does not become large at all.

In addition, when the width of the mode filter is set to the range of 1.5 to 10 µm, since the length of the mode filter does not become remarkably large, the size of the semiconductor optical device does not become large at all.

In addition, when the width of the optical waveguide is set to the range of 1 to 10 μm, since the length of the mode filter does not become remarkably large, the size of the semiconductor optical device does not become large at all.

Further, when the lamination structure of the mode filter is made the same as that of the optical waveguide, the semiconductor optical device can be readily manufactured.

In this case, when the uniform lamination structure is formed on the semiconductor substrate, and the lamination structure is selectively etched away so as to obtain a pattern with the different widths, thereby forming both the optical waveguide and the mode filter, the semiconductor optical device can be very readily manufactured.

Furthermore, each of the fiber optical amplifier and the optical transmission system according to the embodiments of the present invention operates stably for a long term.

What is claimed is:

1. A semiconductor optical device comprising:
   an optical waveguide being operative in a multi-mode in a direction perpendicular to a light propagation direction in said waveguide, said multi-mode direction being a widthwise direction of said waveguide; and
   a mode filter provided in at least a part of said optical waveguide such that said optical waveguide has an inlet port side part adjacent to an inlet port of said mode filter and an outlet port side part adjacent to an outlet port of said mode filter sandwiching said mode filter and light of a fundamental mode and light of a higher-order mode are excited in said inlet port side part of said optical waveguide toward said mode filter, a width of said optical waveguide, a width of said mode filter perpendicular to the light propagation direction and a length of said mode filter being determined such that light of the fundamental mode of said inlet port side part of said optical waveguide entering said mode filter from said inlet port side part of said optical waveguide has a light intensity distribution in said outlet port of said mode filter approximately equal to that in said inlet port of said mode filter, while light of the higher-order mode of said inlet port side part of said optical waveguide entering said mode filter from said inlet port side part of said optical waveguide has a light intensity distribution in said outlet port in which light is concentrated outside said outlet port side part of said optical waveguide, said width of said mode filter being larger than that of said optical waveguide, whereby said light of the higher mode entering said mode filter from said inlet port side part of said optical waveguide is blocked from entering said outlet port side part of said optical waveguide.

2. A semiconductor optical device according to claim 1, wherein said optical waveguide is mainly made of semiconductor materials.

3. A semiconductor optical device according to claim 1, wherein the width of said mode filter is 1.5 to 4 times as large as that of said optical waveguide.

4. A semiconductor optical device according to claim 3, wherein said mode filter has a length identical with a period of a periodical change of the light intensity distribution, in said mode filter, of the light of the fundamental mode of said inlet port side part of said optical waveguide.

5. A semiconductor optical device according to claim 1, wherein the width of said mode filter is in the range of 1.5 to 10 μm.

6. A semiconductor optical device according to claim 1, wherein the width of said optical waveguide is in the range of 1 to 10 μm.

7. A semiconductor optical device according to claim 1, wherein the width of said mode filter varies in the direction along which the light is propagated.

8. A semiconductor optical device according to claim 7, wherein a uniform lamination structure of a lamination layers is formed on a semiconductor substrate and said lamination structure is selectively etched away so as to obtain a pattern with different widths, thereby forming both said optical waveguide and said mode filter.

9. A semiconductor optical device according to claim 1, wherein said mode filter has lamination layers in a lamination structure identical with that of lamination layers of said optical waveguide.

10. A semiconductor optical device according to claim 1, wherein said semiconductor optical device constitutes one of a semiconductor laser, an optical modulator, and an optical switch.

11. A fiber optical amplifier employing the semiconductor laser as defined in claim 10.

12. An optical transmission system employing the optical modulator as defined in claim 10.

13. A semiconductor optical device according to claim 1, wherein a Y-branch is provided in a middle portion of said optical waveguide.

14. A semiconductor optical device according to claim 1, wherein the width of said optical waveguide perpendicular to the light propagation direction, the width of said mode filter, and the length of said mode filter in the light propagation direction are determined in such a way that with respect to light of a fundamental mode of said optical waveguide, said mode filter has a distribution of light intensity in an inlet port of said mode filter is substantially equal to a distribution of light intensity in an outlet port of said mode filter.

15. A semiconductor optical device comprising:
   an optical waveguide formed on a semiconductor substrate and being in a multi-mode operation for confinement of an optical field in a transverse direction parallel with a main surface of said semiconductor substrate, said transverse direction being a widthwise direction of said optical waveguide; and
   a mode filter provided in a part of said optical waveguide such that said optical waveguide has an inlet port side part adjacent to an inlet port of said mode filter and an outlet port side part adjacent to an outlet port of said mode filter sandwiching said mode filter and light of a fundamental mode and light of a higher-order mode are excited in said inlet port said part of said optical waveguide toward said mode filter, a width of said optical waveguide, a width of said mode filter in said transverse direction and a length of said mode filter being determined such that light of the fundamental mode of said inlet port side part of said optical waveguide entering said mode filter from said inlet port side part of said optical waveguide has a light intensity distribution in said outlet port of said mode filter approximately equal to that in said inlet port of said mode filter, while light of the higher-order mode of said inlet port side part of said optical waveguide entering said mode filter from said inlet port side part of said optical waveguide has a light intensity distribution in said outlet port in which light is concentrated outside said outlet port side part of said optical waveguide, said width of said mode filter being larger than that of said optical waveguide, whereby said light of the higher mode entering said mode filter from said light port side part of said optical waveguide is blocked from entering said outlet port side part of said optical waveguide.

* * * * *